United States Patent [19]
Colling et al.

[11] Patent Number: 5,941,300
[45] Date of Patent: Aug. 24, 1999

[54] SELF-CONTAINED HEAT EXCHANGE APPARATUS

[75] Inventors: Ronald W. Colling; Kenneth C. Altekruse, both of Appleton; Kenneth F. Herres, Sherwood, all of Wis.

[73] Assignee: Illinois Tool Works Inc., Glenview, Ill.

[21] Appl. No.: 08/652,655

[22] Filed: May 28, 1996

[51] Int. Cl.⁶ .............................. F24H 3/00; H05K 7/20
[52] U.S. Cl. ........................ 165/47; 361/695; 220/608
[58] Field of Search ........................... 220/608; 165/47; 215/10; 361/698, 695; 137/312; 123/2

[56] References Cited

U.S. PATENT DOCUMENTS

| | | | |
|---|---|---|---|
| 4,270,695 | 6/1981 | Carson | 165/47 |
| 4,420,168 | 12/1983 | Dewing | 280/43.1 |
| 4,805,793 | 2/1989 | Brandt | 215/10 |
| 5,121,788 | 6/1992 | Carollo | 165/47 |

OTHER PUBLICATIONS

Miller Owner's Manual, Form: OM–626B, Oct. 1993.

*Primary Examiner*—Ira S. Lazarus
*Assistant Examiner*—Lance Chandler
*Attorney, Agent, or Firm*—Foley & Lardner

[57] ABSTRACT

A heat exchange system for cooling a coolant is provided having a pump coupled to the motor to pump coolant, a radiator for cooling the coolant, and a resilient hollow reservoir for holding coolant in the form of a planar base portion and an annular portion integrally coupled to and extending upwards from the base portion.

26 Claims, 7 Drawing Sheets

SELF-CONTAINED HEAT EXCHANGE APPARATUS

FIELD OF THE INVENTION

The present invention relates generally to heat exchangers, and more particularly to self contained heat exchangers with integral motor, fan radiator and double-walled reservoir forming the shell of the heat exchanger.

BACKGROUND OF THE INVENTION

In the field of heat exchangers for welding supplies, a number of basic configurations have been used. Typically, these systems include a reservoir, a motor for driving a fan and a coolant pump, a reservoir for containing coolant and a connection/control panel for making coolant connections to external welding equipment, and for controlling the heat exchanger itself.

In one configuration, the coolant reservoir is attached separately to the structural framework of the device, typically a metal framework. These configurations are typically rectangular in construction since the framework is made of sheet metal, easily formed into rectangular shapes. In these systems, a radiator is disposed at one end of the heat exchanger, the connection/control panel is disposed at the other end of the unit, and air is drawn in through the sides of the unit and is exhausted through the radiator. Such systems provide easy access to interior components by unscrewing and removing portions of the sheet metal outer skin. They also are easily stackable one on top of the other, or atop the welding power supply itself. A disadvantage to such systems is their complexity of construction, typically requiring many components that must be assembled separately.

In an alternative configuration, such as that disclosed in U.S. Pat. No. 5,121,788 issued on Jun. 16, 1992, to G. Carollo, the substantially rectangular structural elements forming the framework of the heat exchanger are replaced with a single hollow cylindrical element that serves as the chassis for a motor, fan, pump and radiator, and a reservoir for the coolant fluid. The radiator is disposed at one (open) end of the cylinder, and the motor with attached pump and fan is located within, and parallel to the central axis of, the cylinder. Due to this cylindrical design, the other end of the cylinder has no connection/control panel, but is open to allow air to flow axially through the cylinder and radiator. By providing a single resilient element that performs both a chassis function as well as a reservoir function, the complexity of the first configuration is avoided. As a result, however, there are several disadvantages: the connection/control panel is eliminated, there is no easy access to the internal elements of the device, and the system is not easily stacked.

There is a need, therefore, for an improved heat exchanger, especially a heat exchanger for welding machines. In particular, there is a need for heat exchangers with reduced complexity. A heat exchanger is needed having easy access to internal components. Furthermore, a heat exchanger is needed that provides easily accessible connectors and controls.

SUMMARY OF THE PRESENT INVENTION

The present invention features a heat exchanger that is intended to respond to these needs. The system is particularly suited to cooling of welding tools having coolant ducts therethrough. It is adapted to be placed on top of the welding machine and to remain in place by engagement with a lug extending from the upper surface of the welding machine.

Thus, in accordance with a first aspect of the invention a heat exchange system includes a motor, a pump coupled to the motor to circulate coolant, a radiator coupled to the pump to cool the coolant, a resilient hollow reservoir to hold the coolant, including a planar base portion and an annular portion integrally coupled to the base portion and extending upwardly from it. A fan may be coupled to the motor and be shrouded within the annular portion. A control panel may be provided on a second end of the base portion. A cover may be provided to enclose the motor and pump extending between the arcuate portion and the control panel. Air vents may be disposed in the cover. The reservoir may have a drip pan for catching coolant leaks. There may be indentations on the bottom surface of the reservoir to prevent lateral movement of the heat exchange system by interfering with upwardly extending members of a supporting piece of machinery. Handholds may be provided in the bottom of the reservoir that may be oriented along a center line of the heat exchange system in a direction substantially parallel to a rotational axis of the motor. These handholds may be disposed along an axis of symmetry of the heat exchange system.

In accordance with another aspect of the invention, a reservoir for a heat exchange system is provided, including a planar base portion, and an annular portion extending upwardly above the base portion from a first end of the base portion. The base portion may be indented to form a motor-receiving platform. The motor-receiving platform may have an air channelling indentation. The base portion may include a drip tray disposed to receive coolant leaks. This tray may have an overflow channel. The annular portion may be adapted to shroud a fan. The planar base portion may have a plurality of indentations on its lower surface adapted to receive protrusions from an upper surface of a heat exchange system. The planar base portion may have an indentation adapted to receive a lug extending upwardly from a welding machine.

Other principal features and advantages of the invention will become apparent to those skilled in the art upon review of the following drawings, the detailed description and the appended claims.

Figure 1:
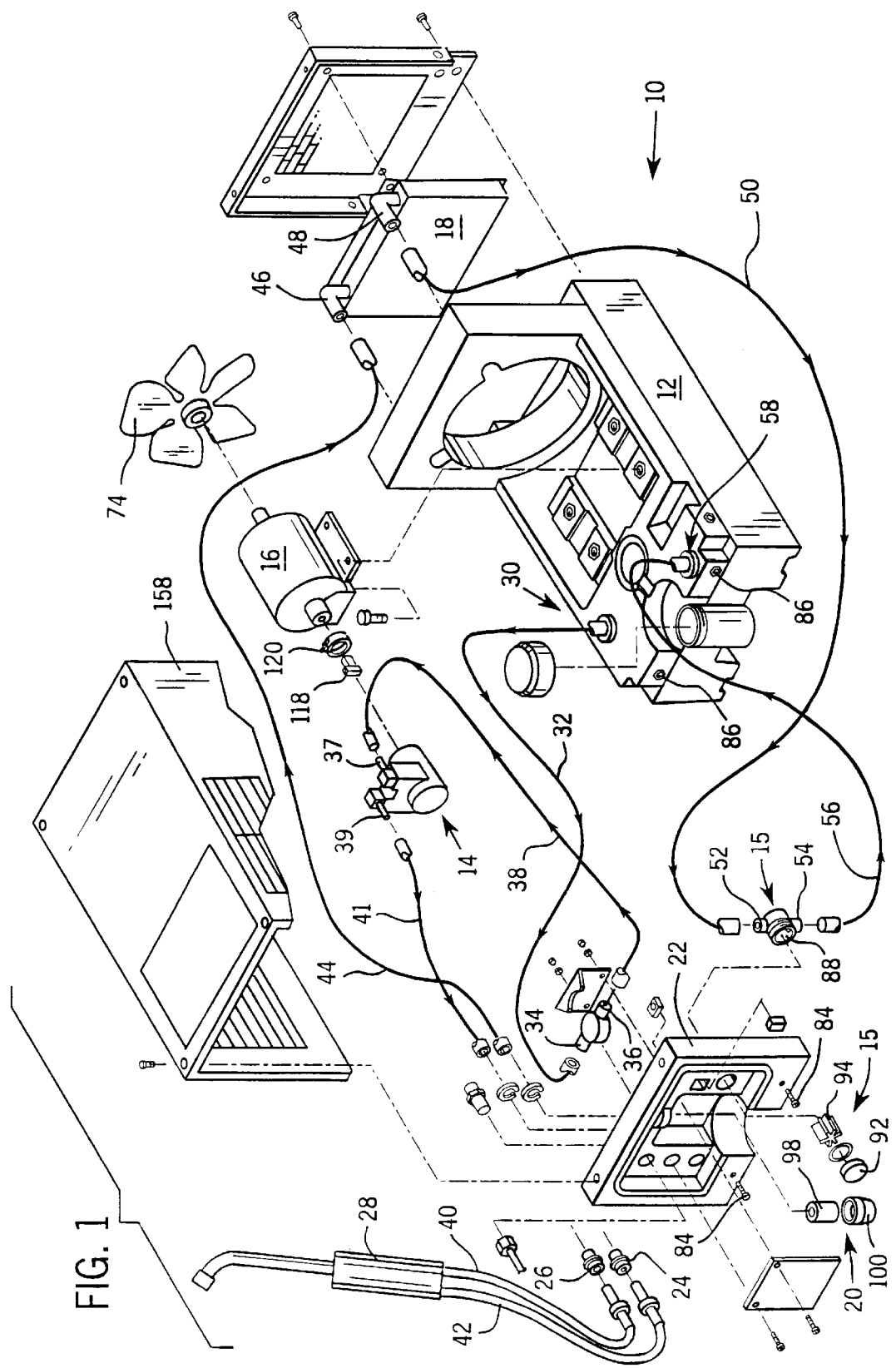
FIG. 1 is a diagrammatic view of the fluid flow path of a heat exchanger in accordance with the present invention.

Before explaining at least one embodiment of the invention in detail it is to be understood that the invention is not limited in its application to the details of construction and the arrangement of the components set forth in the following description or illustrated in the drawings. The invention is capable of other embodiments or being practiced or carried out in various ways. Also, it is to be understood that the phraseology and terminology employed herein is for the purpose of description and should not be regarded as limiting.

DETAILED DESCRIPTION OF THE PREFERRED EMBODIMENTS

Turning now to the drawings and referring to FIG. 1, a heat exchanger 10 having a coolant reservoir 12 with coolant, a pump 14 for pumping the coolant, a flow indicator 15 for indicating coolant flow, a motor 16 for operating pump 14, a radiator 18 for cooling the coolant, a filter 20 for filtering the coolant, and a control panel 22 with inlet port 24 and outlet port 26 for providing coolant interconnections with tools, such as welding tool 28. Fluid flow tubing, represented schematically here as lines with arrows, interconnects these various components.

The coolant is drawn from outlet port 30 of reservoir 12 by pump 14 through fluid conduit 32 coupled to outlet port 30. Coolant passes through conduit 32 to an inlet port 34 of filter 20, through filter element 98 and thence to outlet port 36 of filter 20. Fluid conduit 38 is fluidly coupled to outlet port 36 and conducts coolant to inlet port 37 of pump 14 to which it is fluidly coupled. Pump 14 pumps coolant out outlet port 39 of pump 14 into fluid conduit 41. Fluid conduit 41 conducts the coolant to outlet port 26 which is mechanically coupled to, and passes through, control panel 22. Outlet conduit 40 is fluidly coupled to outlet port 26, and conducts coolant to an inlet port on tool 28. After receiving heat energy from tool 28, coolant exits an outlet port on tool 28. It is conducted back to heat exchanger 10 through inlet conduit 42. Conduit 42 is fluidly coupled to inlet port 24 which is mechanically coupled to and passes through, control panel 22. From inlet port 24, fluid is conducted through fluid conduit 44, which is fluidly coupled to inlet port 46 of radiator 18. As coolant travels through radiator 18 toward outlet port 48 of radiator 18, it is cooled by air pulled though radiator 18 by fan 74 driven by motor 16. After being cooled, coolant exits radiator 18 through outlet port 48 into conduit 50, fluidly coupled to outlet port 48. After passing through conduit 50, the coolant is received by flow indicator 15 which is fluidly coupled to conduit 50 at inlet port 52. The coolant then departs flow indicator 15 through outlet port 54 into fluid conduit 56, to which outlet port 54 is fluidly coupled. The coolant then passes through conduit 56 to inlet port 58 of reservoir 12, to which it is fluidly coupled, and into reservoir 12. This describes the fluid flow path of coolant through the heat exchanger and interconnected tool.

Figure 2:
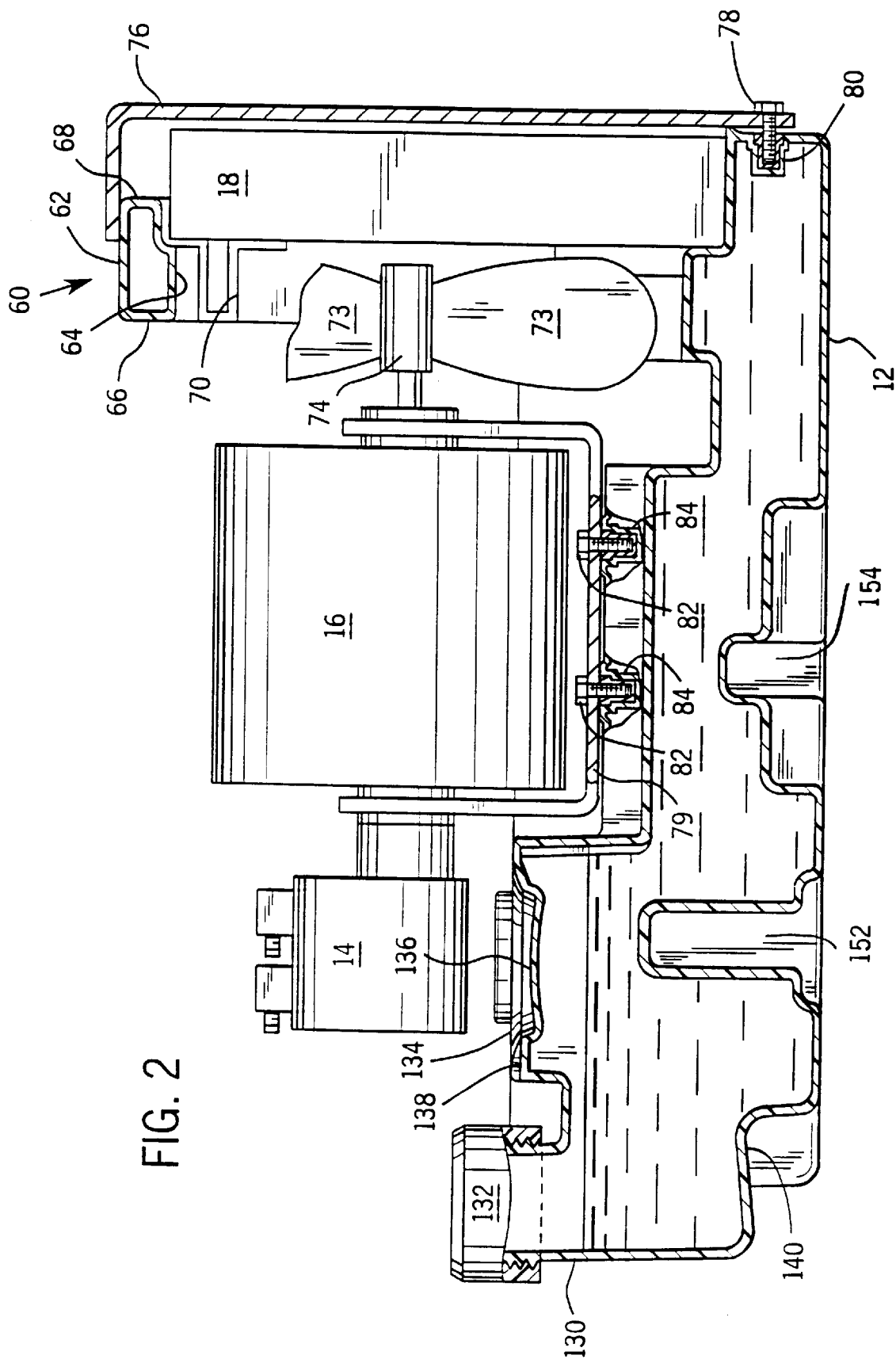
FIG. 2 is a partial cross-sectional side view of the heat exchanger of FIG. 1.
Figure 3:
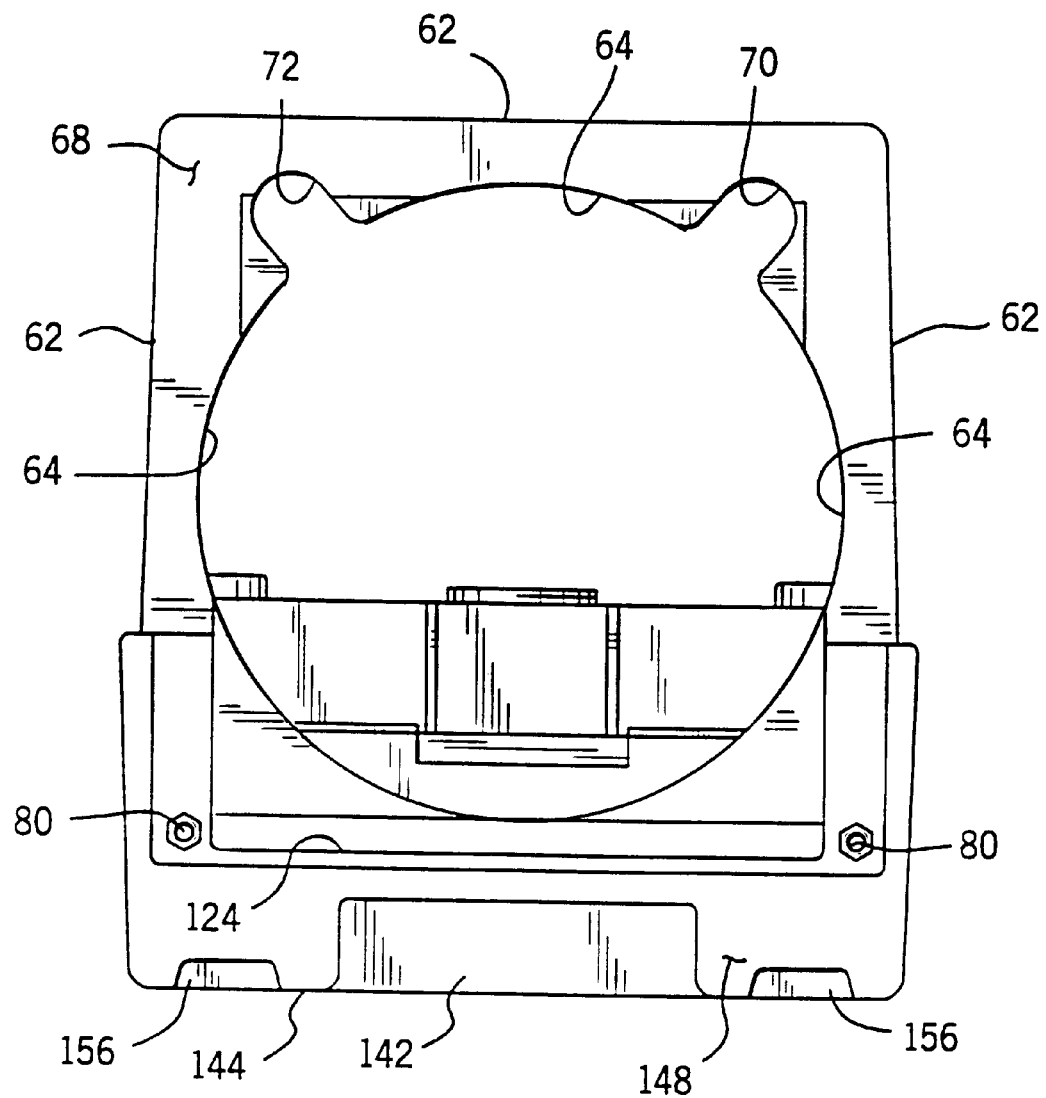
FIG. 3 is an end view of the reservoir of the heat exchanger of FIG. 1.

Referring now to FIGS. 2 and 3, both illustrating an exemplary heat exchanger, reservoir 12 includes an annular forward portion 60 having a substantially rectangular outer surface 62, and an inner surface 64, interconnected by back wall 66 and front wall 68 to provide a hollow interior. The annular portion is preferably integrally formed together with the base portion from a resilient polymeric material to provide a unitary hollow structure.

Radiator 18 is coupled against front wall 68. Inlet and outlet ports 46 and 48 extend from radiator 18, back through reliefs 70 and 72 in inner surface 64 toward the other components of the heat exchanger. Reliefs 70 and 72 are sized to receive and be substantially filled by inlet and outlet ports 46 and 48, respectively. The effect is to provide a substantially circular air flow passage through annular portion 60 having a border comprised of inner surface 64 facing fan 74. Inner surface 64 is spaced apart from the outermost extent of the blades 73 of fan 74 by approximately ¼" to provide maximum air flow.

Rear panel 76 supports and protects the outer surface of radiator 18. Panel 76 with radiator 18 is itself attached to reservoir 12 by screws 78 that pass through panel 76 and screw into threaded bosses 80 that are molded into reservoir 12.

Motor 16 with integral mounting bracket 79 is attached to reservoir 12 with bolts 82 that are screwed into threaded bosses 84 that are molded into reservoir 12. Motor 16 is coupled to and drives both fan 74 and pump 14. Fan 74 draws air through both panel 76 and radiator 18 to cool the coolant in radiator 18.

Pump 14 is preferably a positive displacement vane pump. It is attached to one end of motor 16 and is rotationally coupled thereto by coupler 118 (FIG. 1) which engages the rotating shaft of motor 16 with the shaft of pump 14. Pump 14 is maintained in a coupled relationship with motor 16 by clamp 120 (FIG. 1), which engages both pump 14 and motor 16.

Figure 4:
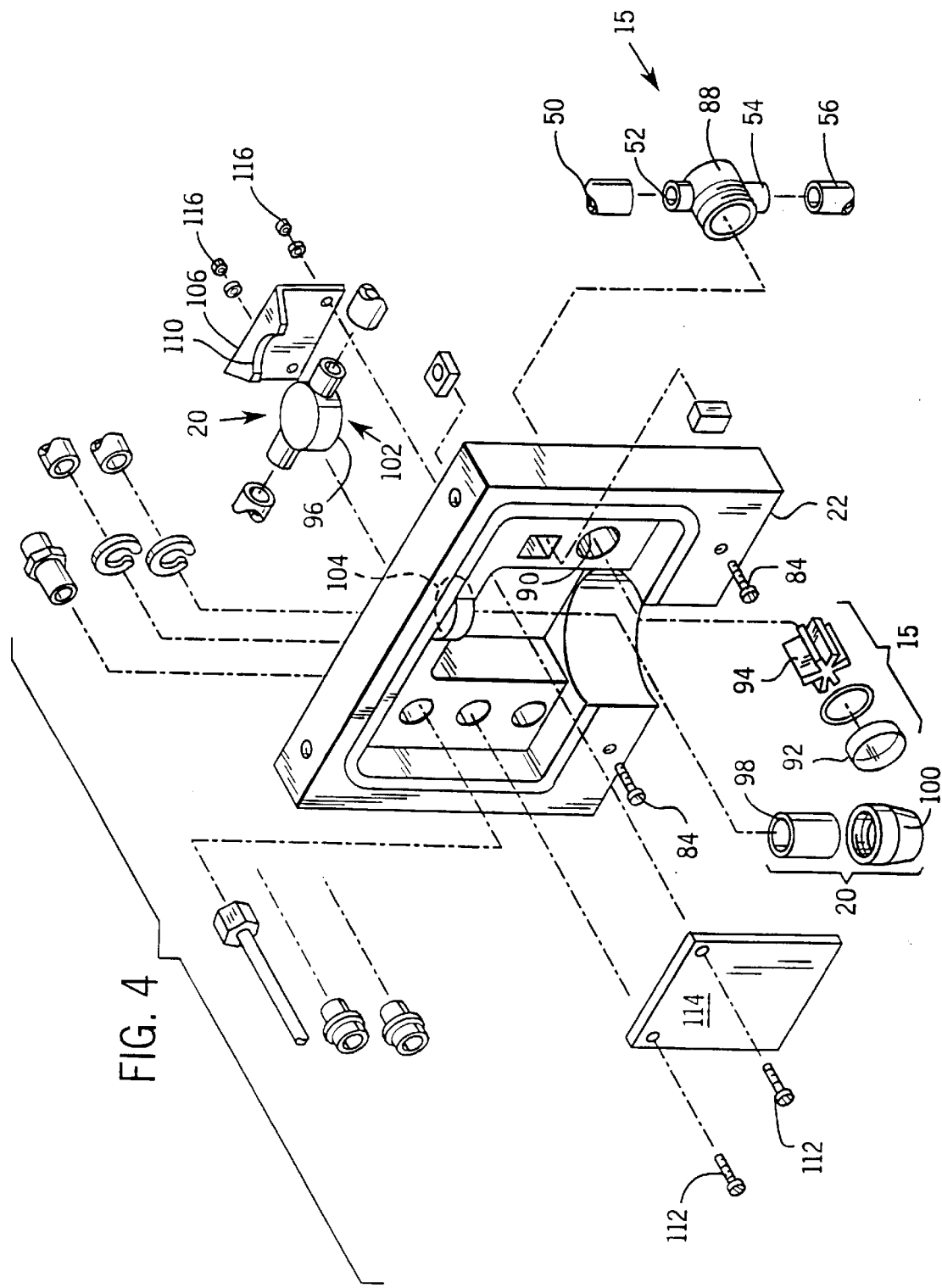
FIG. 4 is an exploded view of the control panel of the heat exchanger of FIG. 1.

Referring to FIGS. 1 and 4, control panel 22 is coupled to reservoir 12 with screws 84 that screw into threaded bosses 86 molded into the reservoir. Panel 22 supports flow indicator 15 having a body 88 from which inlet and outlet ports 52 and 54 extend located inside panel 22. Body 88 includes a cylindrical threaded portion that extends through a hole 90 in panel 22 to the outside of panel 22. Body 88 is enclosed by clear cover 92, having internal threads to threadedly engage body 88. A rotor 94 having a plurality of vanes is inside the body, and is rotated by coolant passing through the flow indicator. This spinning rotor, typically brightly colored, indicates that flow exists. Since cover 92 is clear, observers can view the spinning rotor as an indication of coolant flow.

Panel 22 further supports filter 20, which includes a filter body 96, a filter element 98, and a filter element housing 100. Inlet and outlet ports 34 and 36 extend from filter body 96. Filter body 96 has a downwardly facing filter opening 102 that is adapted to threadedly engage filter element housing 100, and which together enclose and support filter element 98. Filter body 96 is disposed inside the heat exchanger and over horizontal hole 104 in panel 22, allowing filter element 98, enclosed by filter element housing 100, to extend through hole 104 to the outside of panel 22. This allows external access to filter element 98 for filter cleaning and changing, while keeping all fluid connections to filter 20 securely on the inside of the heat exchanger.

Filter 20 is supported between panel 22 and filter bracket 106. Panel 22 has an arcuate recess on its inner surface. Filter bracket 106 has a similar arcuate recess 110. Filter body 96 is disposed such that a portion of its arcuate outer surface is received in the arcuate recess in panel 22, and an opposing portion of its arcuate outer surface is received in arcuate recess 110. Filter bracket 106 is maintained in this position by screws 112 that pass through holes in information panel 114, holes in panel 22 and holes in filter bracket 106. Screws 112 are secured by nuts 116.

Figure 5:
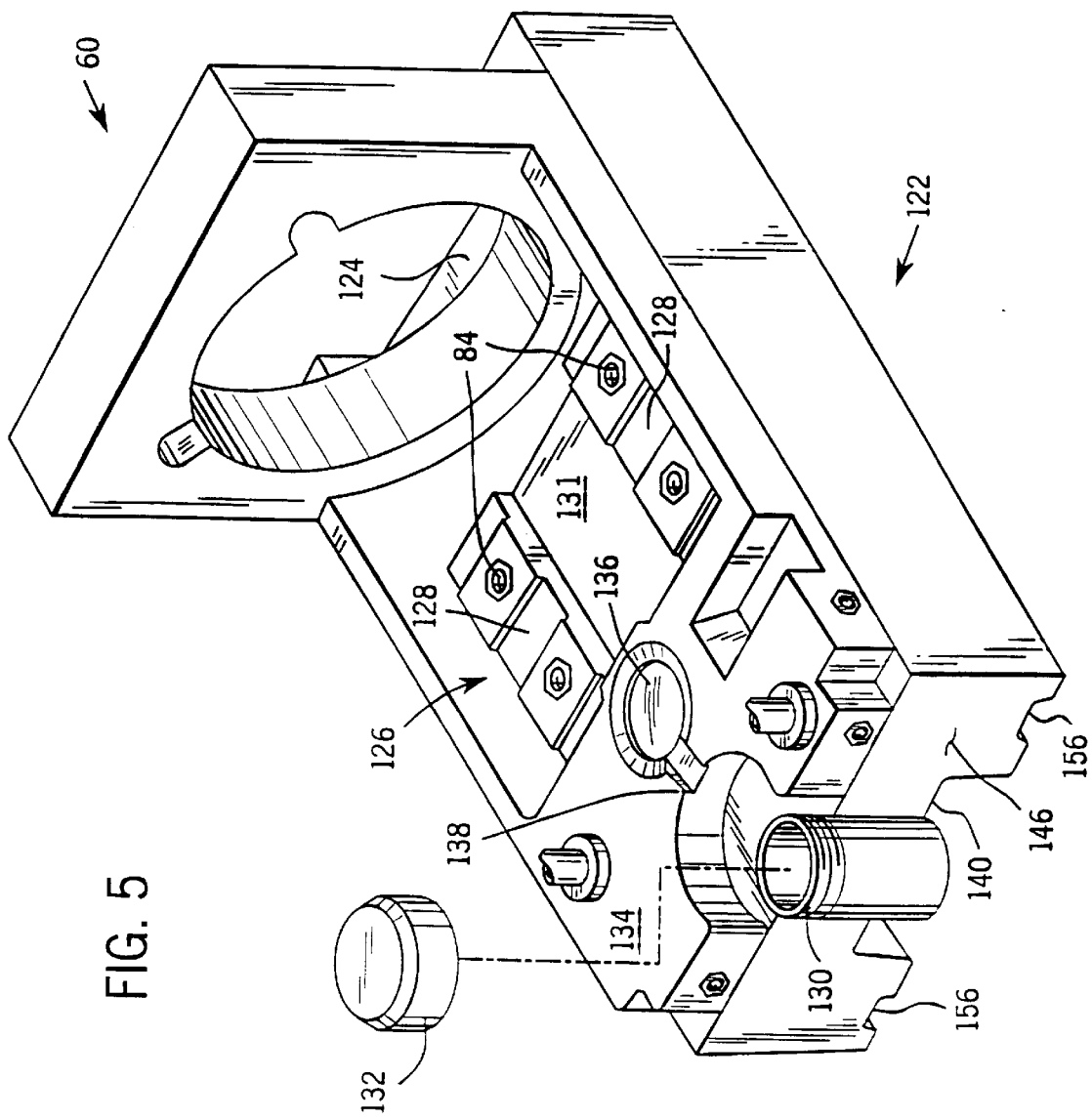
FIG. 5 is a perspective view of the reservoir of FIG. 1.

Referring to FIGS. 2 and 5, housing 12 is in the form of a substantially rectangular and horizontally extending base portion 122 and the rear annular portion 60 extending vertically from the base portion at one end of the base portion. A shelf 124 extends horizontally from the annular portion to support radiator 18 and protect it from injury when handled roughly. Housing 12 has a longitudinally extending recess 126 for receiving motor 16. This recess has a mounting platform 128 upon which motor 16 is mounted. This platform has four molded-in threaded bosses 84 to which motor mounting bolts are attached. This platform has a cooling channel 131 under motor 16 to allow air from fan 74 to flow between motor 16 and reservoir 12 for additional cooling.

An externally threaded fill pipe 130 is provided at the front of reservoir 12 through which the reservoir is filled.

Fill cap 132, which is internally threaded, screws onto this fill pipe after reservoir 12 is filled to prevent coolant from leaking out.

Upper surface 134 of base 122 has a drip tray recess 136 disposed to catch and contain fluid leaks from the various components in the system, and the pump in particular. If recess 136 is filled by the small common leaks in the system, the fluid in this recess will evaporate before recess 136 fills. Thus, small fluid leaks are contained as they dry, and cannot migrate out of the heat exchanger, contaminating other devices, such as welding power supplies, upon which this heat exchanger may be mounted. If recess 136 is filled by larger leaks, excess fluid will spill out of recess 136 through overflow channel 138 formed in surface 134 of base 122 toward fill pipe 130. Many users naturally anticipate and provide for spills in the vicinity of fill pipe 130, such as by providing absorbent materials in the vicinity of fill pipe 130. By providing a conduit that directs leakage flows toward the fill spout, this system capitalizes on that tendency and reduces the risk that such overflows will cause damage to other devices.

Figure 7:
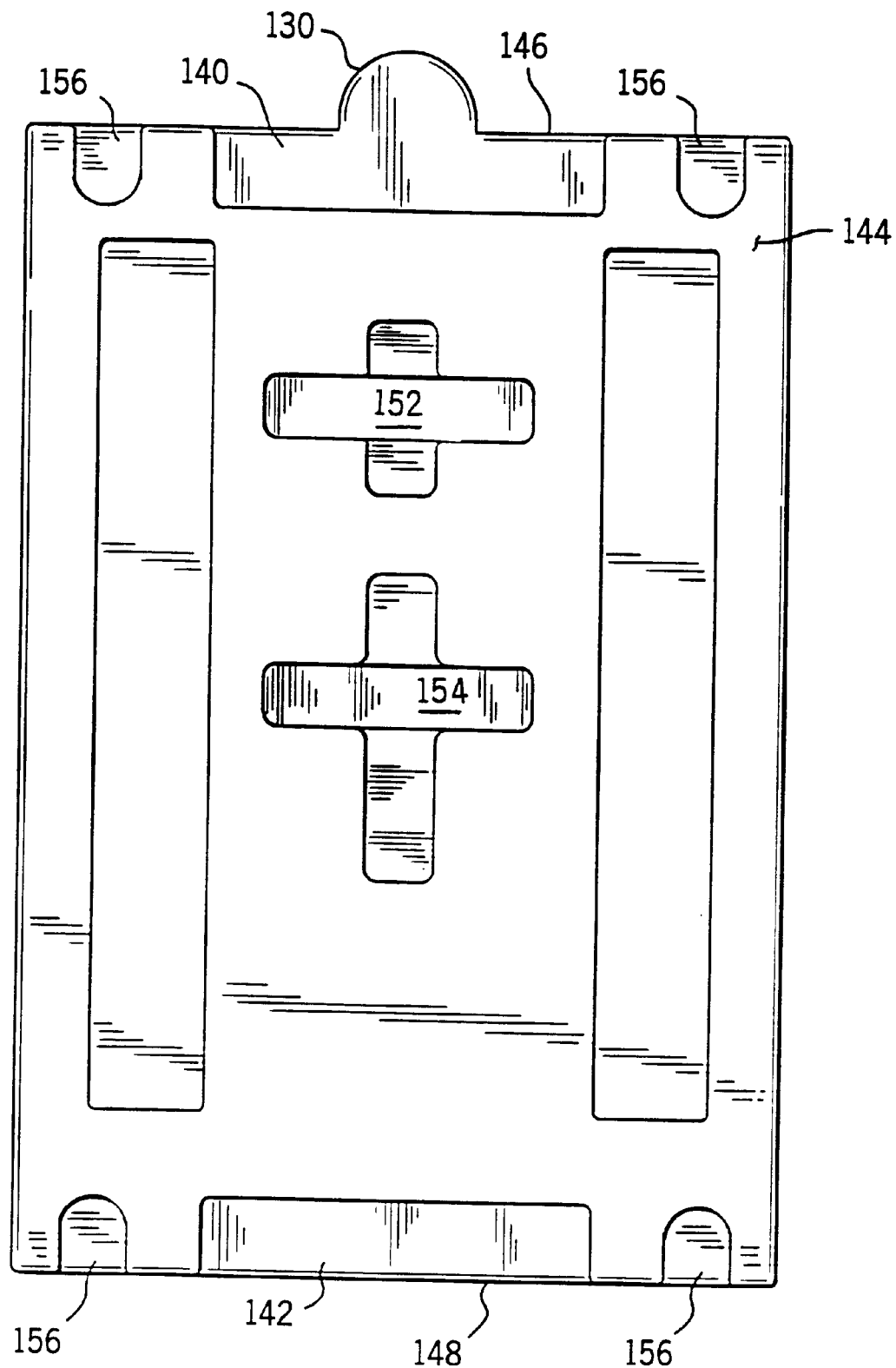
FIG. 7 is a bottom view of the heat exchanger of FIG. 1.

Referring to FIGS. 1, 3 and 7, the reservoir is provided with two handles 140 and 142. Front handle 140 is located at the front of the heat exchanger, and rear handle 142 is located at the rear of the heat exchanger. The front handle is in the form of a lateral recess in bottom surface 144 and front surface 146 of reservoir 12. The rear handle is in the form of a lateral recess in bottom surface 144 and rear surface 148 of reservoir 12. These handles are preferably formed integrally with reservoir 12.

Although such recesses could be located at the intersection of any side wall and the bottom surface of the reservoir, there is a particular advantage in locating them along an axis of symmetry, and at the ends of the greatest longitudinal extent of the heat exchanger.

Heat exchanger 10 is balanced upon the tops of the user's fingers when it is lifted by handles 140 and 142. Since the handles are located at the bottom of the unit, below the center of mass, the heat exchanger may tip off the user's fingers. Due to the front-to-rear asymmetry of the unit, the center of mass may vary significantly front-to-back depending upon the amount of water in the reservoir. Conversely, due to the side-to-side symmetry of the heat exchanger, the side-to-side center of mass stays relatively constant with varying levels of fluid in the reservoir. Thus, a user grasping the handles along the axis of greatest symmetry, in this case the front-to-rear axis, is more able to balance the reservoir.

Referring to FIGS. 2 and 7, nesting recesses 152 and 154 are provided along the longitudinal axis of heat exchanger 10 in bottom surface 144. These nesting recesses are adapted to receive the special lifting lugs extending from the top of welding power supplies. Heat exchanger 10 is well suited to cooling welding tools that are powered by such supplies, and thus heat exchanger 10 is commonly used in proximity to such welding supplies. Lifting lugs are typically provided on top of welding supplies, allowing them to be lifted and moved. It is particularly advantageous to save space by placing heat exchangers adapted to cool welding tools on top of such power supplies. By disposing heat exchanger 10 on top of a welding power supply and receiving its lifting lug into recess 152 or 154, the heat exchanger will be maintained in place and will not slide off. The recesses can be transversely disposed, having a side-to-side width greater than their front-to-back extent to accommodate transversely mounted lifting lugs. Alternatively, the recesses can be oriented front-to-back, having a front-to-back extent greater than their side-to-side extent to accommodate lifting lugs that are similarly disposed front-to-back. As in the case of either recesses 152 or 154, these recesses can be combined to have a cruciform shape adapted to receive either front-to-back or side-to-side oriented lifting lugs.

Referring to FIGS. 3, 5 and 7, stacking recesses 156 are formed in bottom surface 144 of reservoir 12. These recesses are adapted to mate with protrusions extending from the top of cover 158 (discussed below) of a second similarly configured heat exchanger, thus allowing an upper heat exchanger to be stacked upon a lower heat exchanger without sliding off. In this arrangement, recesses 156 on the upper heat exchanger mate with the protrusions on the lower heat exchanger, and maintain the upper heat exchanger in a proper position above the lower heat exchanger.

Figure 6:
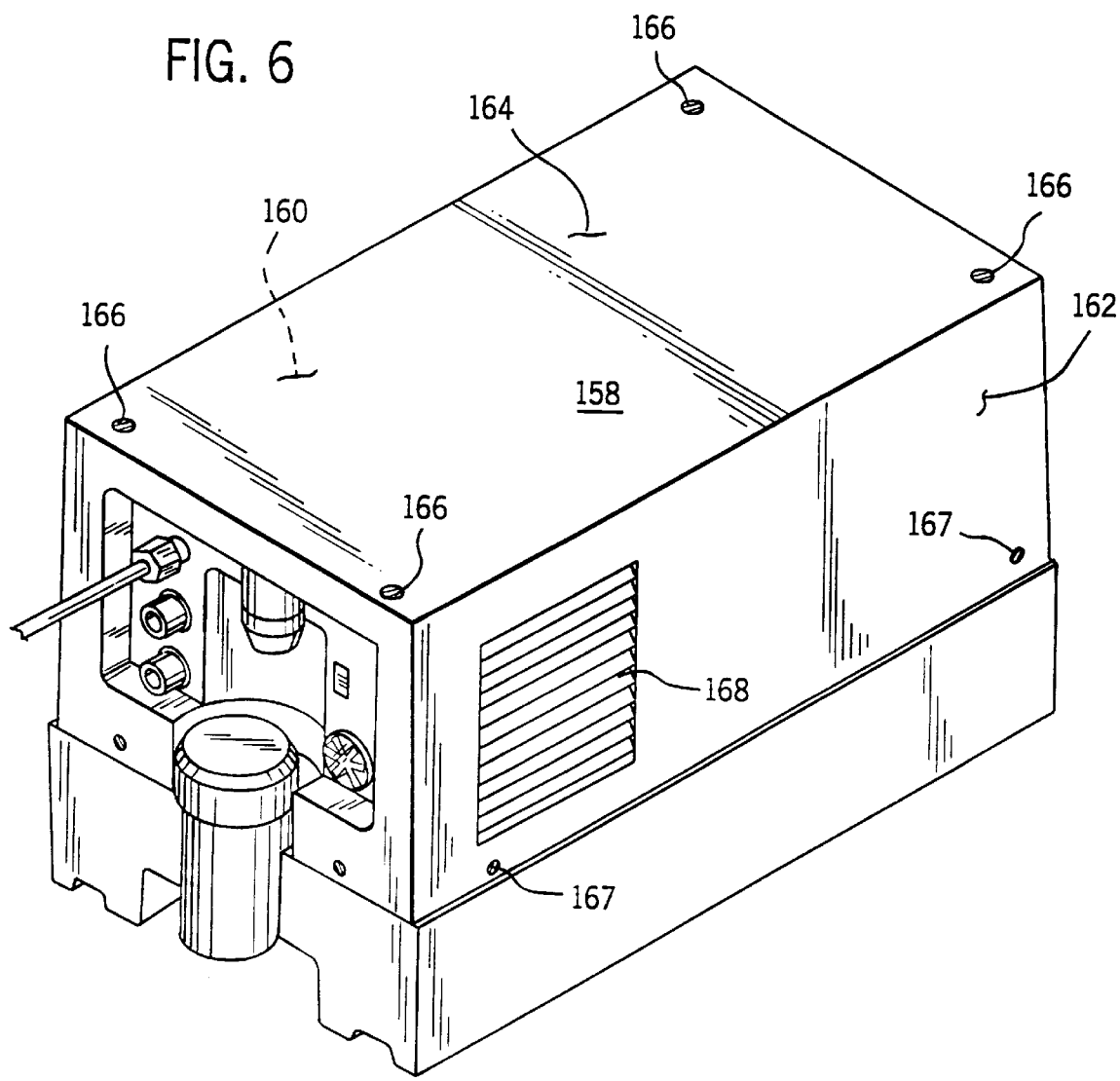
FIG. 6 is a perspective view of the heat exchanger of FIG. 1.

FIG. 6 illustrates a perspective view of the heat exchanger with cover 158 attached. Cover 158 encloses the motor and pump of the heat exchanger. It includes two side walls 160 and 162, and top 164. Top 164 is supported by the top surface of annular portion 60 and the top surface of control panel 22 in a substantially horizontal position. Side walls 162 and 160 extend downward from top 164 at approximately a right angle. Cover 158 is coupled to the rest of the heat exchanger by four bolts or screws 166 passing through top 164, two of which are threadedly engaged with threaded bosses molded into control panel 22, and two of which are threaded into mounting holes in rear panel 76. These four bolts or screws extend above the surface of cover 158 and are disposed to engage stacking recesses 156 on a similarly constructed heat exchanger. Four bolts or screws 167 also extend through cover 158, to attach it to threaded bosses molded into the side walls of reservoir 12 and threaded into mounting holes in rear panel 76 (not shown).

Cooling vents 168 are disposed on opposing side walls 160 (not shown) and 162 of cover 158. These vents allow the air that is pulled into the heat exchanger by fan 74 to escape. Alternatively, vents may be provided in a single side wall, or in top 164.

Thus, it should be apparent that there has been provided in accordance with the present invention an improved self-contained heat exchange apparatus that fully satisfies the objectives and advantages set forth above. Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

The embodiments of the invention in which an exclusive property or privilege is claimed are defined as follows:

1. A heat exchange system comprising:

a motor;

a pump mechanically coupled to the motor and adapted to pump a coolant;

a radiator fluidly coupled to the pump and adapted to cool the coolant; and a resilient hollow reservoir adapted to receive and contain the coolant including, a planar base portion, an annular portion extending upwardly from a first end of the base portion and integrally coupled thereto;

a cooling fan coupled to the motor, wherein an interior surface of the annular portion shrouds the cooling fan;

a control panel coupled to a second end of the base portion; and a cover extending between the control panel and the annular portion, and enclosing said motor and pump.

2. The heat exchange system of claim 1, wherein the cover has air vents.

3. The heat exchange system of claim 1, wherein an upwardly facing outer surface of the reservoir is adapted to form a pan.

4. The heat exchange system of claim 1, wherein the reservoir has indentations on a bottom surface.

5. The heat exchange system of claim 4, wherein the indentations are adapted to prevent lateral movement of the heat exchange system by interfering with upwardly extending members of a supporting piece of machinery.

6. The heat exchange system of claim 1, wherein the reservoir has first and second handholds in its lower surface.

7. The heat exchange system of claim 6, wherein the handholds are oriented along a center line of the heat exchange system.

8. The heat exchange system of claim 6, wherein the handholds are disposed along an axis of symmetry of the heat exchange system.

9. A reservoir for a heat exchange system, comprising:
a planar base portion, the base portion having a first end and an outer surface;
an annular portion extending upwardly above the base portion from only the first end of the base portion; and
a tray adapted to receive fluid leaks, the tray being formed by a recess on the upwardly facing outer surface of the base portion.

10. The reservoir of claim 9, wherein the base portion is indented to form a motor-receiving platform.

11. The reservoir of claim 10, wherein the motor receiving platform has an air channelling indentation.

12. The reservoir of claim 9, wherein the base portion further includes an overflow channel formed on the upwardly facing outer surface of the base portion and configured to drain fluid away from the tray.

13. A reservoir for a heat exchange system, comprising:
a planar base portion, the base portion having an outer surface, a first end and a second end;
an annular portion extending upwardly above the base portion from the first end of the base portion;
a motor receiving platform formed by an indentation in the base portion and positioned adjacent the upper surface, wherein the motor receiving platform has an air channeling indentation; and
a tray formed by a recess in the upwardly facing outer surface, the tray being configured to contain fluid leaks, the upwardly facing outer surface and the tray having an overflow channel positioned to drain fluid away from the tray toward the second end of the base portion.

14. The reservoir of claim 9, wherein the annular portion is adapted to shroud a fan.

15. The reservoir of claim 9, wherein the planar base portion has a plurality of indentations on its lower surface adapted to receive protrusions from an upper surface of a heat exchange system.

16. The reservoir of claim 9, wherein the planar base portion has an indentation adapted to receive a lug extending upwardly from a welding machine.

17. The reservoir of claim 13, wherein the annular portion is adapted to shroud a fan.

18. The reservoir of claim 13, wherein the planar base portion has a plurality of indentions on its lower surface adapted to receive protrusions from an upper surface of a heat exchange system.

19. The reservoir of claim 13, wherein the planar base portion has an indention adapted to receive a lug extending upwardly from a welding machine.

20. A reservoir for a heat exchange system, comprising:
a planar base portion; and
an annular portion extending upwardly above the base portion from only a first end of the base portion.

21. The reservoir of claim 20, wherein the base portion has an outer surface, wherein the reservoir further includes a tray adapted to receive fluid leaks, the tray being formed by a recess on the upwardly facing outer surface of the base portion.

22. The reservoir of claim 20, further including a cover enclosing a portion of the base portion not covered by the annular portion.

23. The reservoir of claim 20, wherein the base portion is indented to form a motor-receiving platform.

24. The reservoir of claim 23, wherein the motor receiving platform has an air channeling indentation.

25. The reservoir of claim 20, wherein the reservoir has indentations on a bottom surface.

26. The reservoir of claim 22, wherein the cover extends from the first end to a second end of the reservoir.

* * * * *